(12) United States Patent
Nicholls

(10) Patent No.: US 7,772,933 B1
(45) Date of Patent: Aug. 10, 2010

(54) MULTIPLE BAND OSCILLATOR SYSTEM

(75) Inventor: Charles Nicholls, Nepean (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 46 days.

(21) Appl. No.: 11/733,394

(22) Filed: Apr. 10, 2007

(51) Int. Cl.
*H03B 27/00* (2006.01)

(52) U.S. Cl. ............... 331/46; 331/48; 331/117 FE; 331/177 V; 331/117 R; 331/167

(58) Field of Classification Search ............ 311/46, 311/50, 117 R, 117 FE, 167, 177 V, 36 C; 331/46, 50, 117 R, 117 FE, 167, 177 V, 36 C
See application file for complete search history.

(56) References Cited

U.S. PATENT DOCUMENTS

| | | | |
|---|---|---|---|
| 6,091,304 A * | 7/2000 | Harrer | 331/10 |
| 6,297,704 B1 * | 10/2001 | Nicholls et al. | 331/34 |
| 6,417,740 B1 * | 7/2002 | Anh et al. | 331/48 |
| 6,750,727 B1 * | 6/2004 | Sutardja | 331/117 R |
| 6,785,525 B2 * | 8/2004 | Ries | 455/258 |
| 6,870,432 B2 * | 3/2005 | Li et al. | 331/46 |
| 6,911,870 B2 * | 6/2005 | Gierkink et al. | 331/46 |

* cited by examiner

*Primary Examiner*—James H. Cho
*Assistant Examiner*—Christopher Lo
(74) *Attorney, Agent, or Firm*—Conley Rose, P.C.; Rodney B. Carroll; Bernard Tiegerman

(57) ABSTRACT

In one embodiment, a multiple band oscillator system is disclosed which comprises a first oscillator having a first input, a resonating element, a first output, and a second output. In addition, the multiple band oscillator system also comprises a second oscillator having a second input, a third output, and a fourth output. The first oscillator has a first oscillator frequency and the second oscillator has a and second oscillator frequency. The multiple band oscillator system also contains a tuning capacitive element coupled to the first and second oscillators for determining the second oscillator frequency, and the first oscillator and the second oscillators are both capable of operating the resonating element.

20 Claims, 10 Drawing Sheets

MULTIPLE BAND OSCILLATOR SYSTEM

CROSS-REFERENCE TO RELATED APPLICATIONS

None

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

The present invention relates generally to voltage-controlled oscillators and, more specifically, to multiple band voltage controlled oscillators.

BACKGROUND

Wireless devices use Radio Frequencies (RF) to transmit information. For example, cell phones use amplified RF to transmit voice data to base stations, which allow signals to be relayed to communications networks. Other existing wireless communication devices include Bluetooth, HomeRF and WLAN. In a conventional wireless device, the synchronization of signals is important for reliable communications.

Examples of communications systems that require synchronous communications include Code Division Multiple Access (CDMA) networks, such as those compliant with existing and evolving 3GPP and 3GPP2 specifications, TD-CDMA, TD-SCDMA, WiMAX (i.e., IEEE §802.16) and IEEE §802.20 compliant networks. Each of these technologies may operate over multiple frequencies, or frequency bands.

To permit multiple band operations, multiple band oscillator systems are needed. Multiple band oscillator systems generally comprise two or more oscillators. One of the problems with multiple band oscillator systems is the requirement that individual tuning and resonant elements are required within each of the oscillators. Systems and methods which could share individual tuning and resonant elements would greatly reduce the cost, complexity, and size of multiple band oscillator systems and reduce the chip real estate used by integrated multi-band oscillator solutions.

SUMMARY

In one embodiment, a multiple band oscillator system is disclosed which comprises a first oscillator having a first input, a resonating element, a first output, and a second output. In addition, the multiple band oscillator system also comprises a second oscillator having a second input, a third output, and a fourth output. The first oscillator has a first oscillator frequency and the second oscillator has a and second oscillator frequency. The multiple band oscillator system also contains a tuning capacitive element coupled to the first and second oscillators for determining the second oscillator frequency, and the first oscillator and the second oscillators are both capable of operating the resonating element.

In another embodiment, a method of operating a multiple band oscillator system is disclosed which comprises activating a first oscillator with a resonator coupled to a second oscillator, obtaining a first differential output from the first oscillator, and activating the second oscillator using the resonator in the first oscillator. This method also comprises creating a low impedance node and obtaining a second differential output from the second oscillator.

In yet another embodiment, the multiple band oscillator system comprises a first oscillator having a resonator and a first oscillation frequency, a second oscillator coupled to the first oscillator and having a second oscillation frequency; and a capacitive element coupled to the second oscillator for determining the second oscillation frequency. The multiband oscillator system also comprises a control signal, and the control signal selectively activates the first oscillator and second oscillator. In this embodiment, the multiple band oscillator system is switched between the first and second oscillation frequencies.

These and other features and advantages will be more clearly understood from the following detailed description taken in conjunction with the accompanying drawings and claims.

BRIEF DESCRIPTION OF THE DRAWINGS

For a more complete understanding of the present disclosure and the advantages thereof, reference is now made to the following brief description, taken in connection with the accompanying drawings and detailed description, wherein like reference numerals represent like parts.

DETAILED DESCRIPTION

It should be understood at the outset that although illustrative embodiments of the present disclosure are illustrated below, the present system may be implemented using any number of techniques, whether currently known or in existence. The present disclosure should in no way be limited to the illustrative implementations, drawings, and techniques illustrated below, including the exemplary design and implementation illustrated and described herein, but may be modified within the scope of the appended claims along with their full scope of equivalents. It is further understood that as used herein, terms such as coupled, connected, electrically connected, in signal communication, and the like may include direct connections between components, indirect connections between components, or both, as would be apparent in the overall context of a particular embodiment.

Figure 1A:
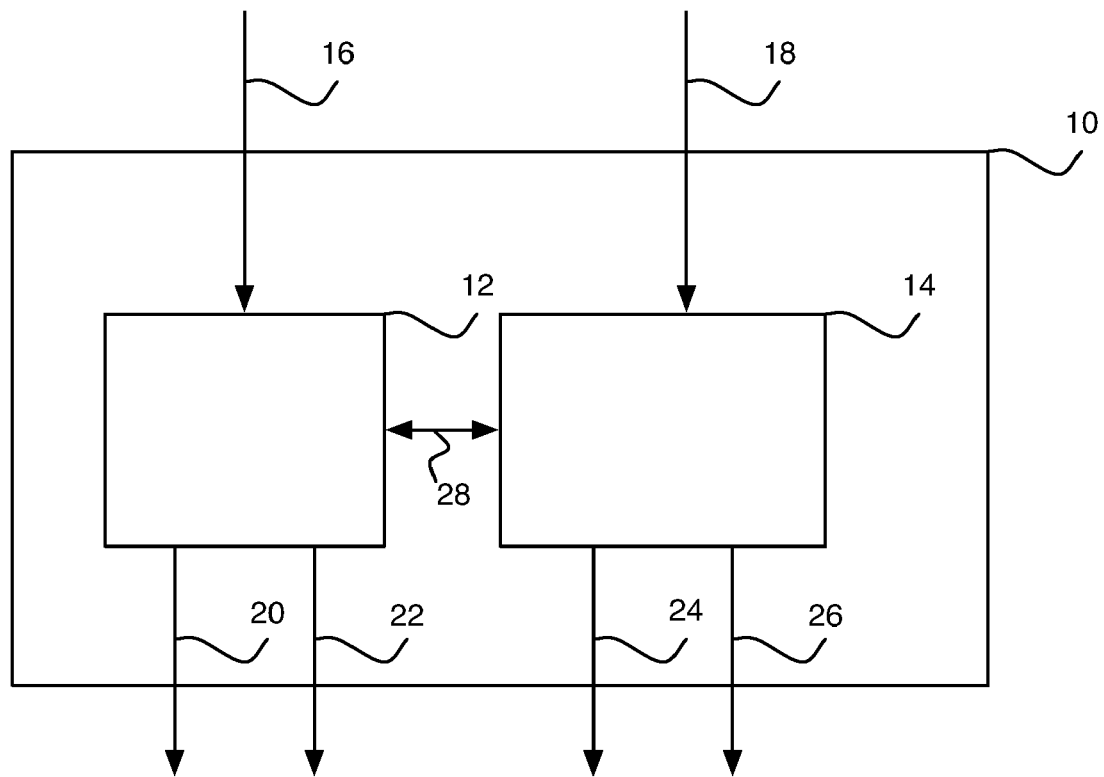
FIG. 1A is an overview of one embodiment of a multiple band oscillator.
Figure 1B:
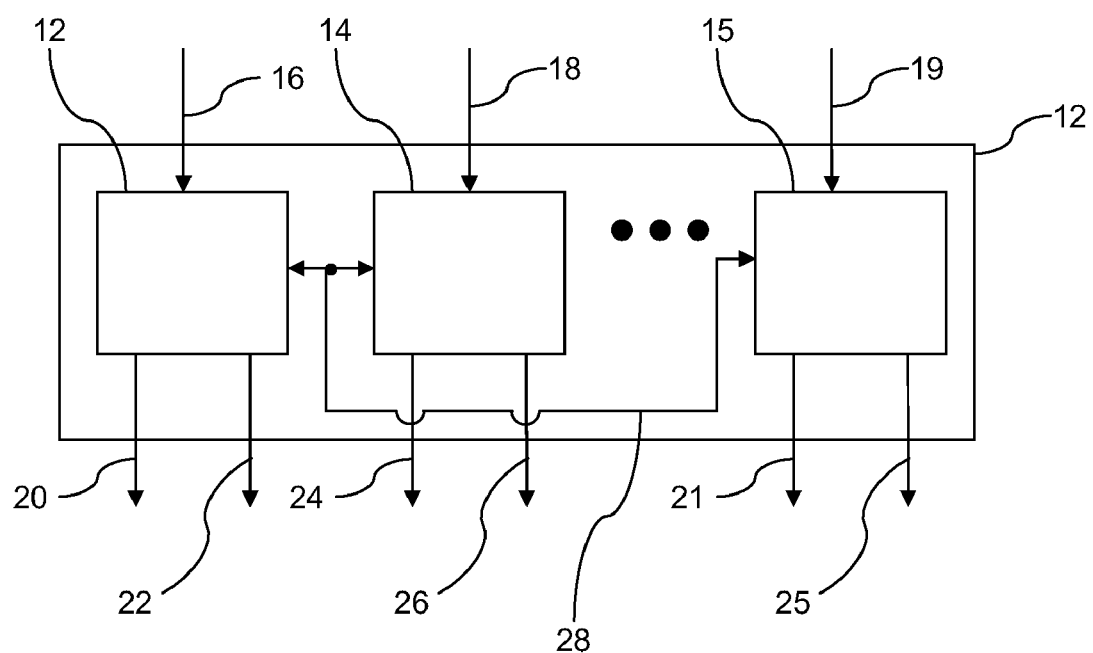
FIG. 1B is an overview of another embodiment of the multiple band oscillator.

FIG. 1A illustrates one embodiment of a multiple band oscillator system 10 comprising a primary oscillator 12 with a primary input 16, a first primary oscillator output 20 and a second primary oscillator output 22. Primary oscillator 12 is coupled through a shared connection 28 to a secondary oscillator 14 with a secondary input 18, a first secondary oscillator output 24, and a second secondary oscillator output 26. In this embodiment, primary oscillator 12 and secondary oscillator 14 receive an input through primary input 16 and secondary input 18. In conventional multiple band oscillator systems, each oscillator must contain a separate tuning module and resonating structure. This approach is both expensive and results in phase noise in the oscillation output. The phrase "phase noise" may refer to the problem introduced by rapid, short-term, or random fluctuations in the phase of a wave that may be caused by time domain instabilities. One of the innovative elements of the present disclosure is that multiple band oscillator system 10 allows a first oscillator to share a resonator or a tuning module with a second oscillator which allows for a reduction of phase noise. In addition, since resonators such as spiral inductors may occupy the largest amount of space on a chip, the space required for multiple band oscillator system 10 may be significantly reduced through the sharing of components. FIG. 1B illustrates another embodiment of the multiple band oscillator system 10 substantially similar to the multiple band oscillator system 10 of FIG. 1A comprising a third oscillator 15 with a third input 19, a first third oscillator output 21 and a second third oscillator output 25. Primary oscillator 12, secondary oscillator 14, and third oscillator 15 are coupled through the shared connection 28. As indicated by the three black dots in FIG. 1B, the use of any number of oscillators is consistent with this disclosure.

In one embodiment, primary input 16 and secondary input 18 provide either, or both, an alternating voltage or current control signal into primary oscillator 12 and secondary oscillator 14. This alternating functionality of input signals allows for the multiple band operation of multiple band oscillator system 10. The phrase "alternating functionality" is intended to include the electric state wherein the voltage input to primary oscillator 12 is high and the voltage input to secondary oscillator 14 is low, and vice versa. The phrase "alternating functionality" also includes the electric state wherein the current input to primary oscillator 12 is high and the current input to secondary oscillator 14 is low, and vice versa. Each oscillator within multiple band oscillator system 10 may be tuned to a different band. Through the alternating functionality of multiple band oscillator system 10, individual oscillators tuned to a particular band may be activated or deactivated generating a signal which may be tuned at multiple bands. It is expressly understood that multiple band oscillator system 10 may be controlled through either, or both, a voltage or current signal originating from the primary input 16 and the secondary input 18.

In one embodiment, primary oscillator 12 and secondary oscillator 14 generate differential outputs. The differential output from primary oscillator 12 and secondary oscillator 14 may be in the form of a wave. When wave output at first primary oscillator output 20 is at its highest positive potential, wave output at second primary oscillator output 22 will be at its lowest negative potential and vice versa. This pair of outputs is collectively referred to as a differential output. In addition, when wave output at second primary oscillator output 24 is at its highest positive potential, wave output at second secondary oscillator output 26 will be at its lowest negative potential and vice versa. This pair of outputs is also collectively referred to as a differential output. Any oscillator which generates a differential output may be referred to as a differential oscillator.

Figure 2:
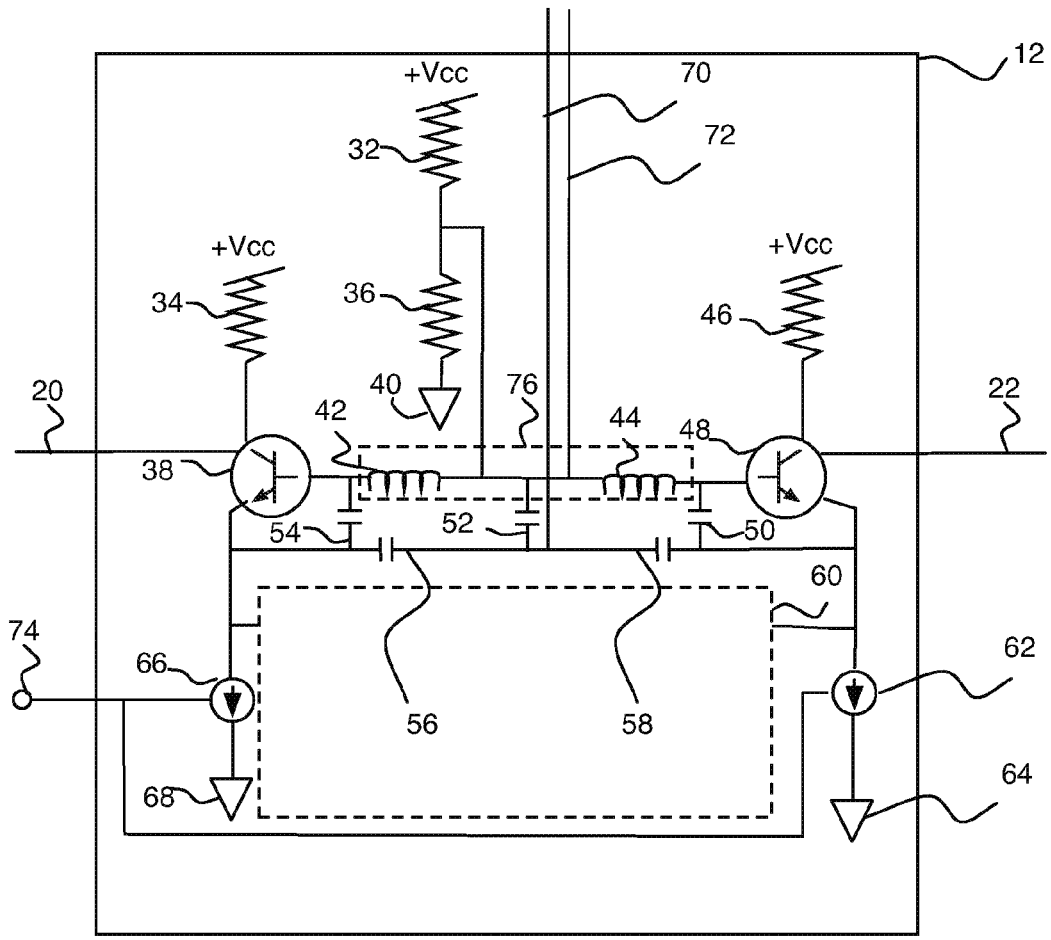
FIG. 2 is an exemplary diagram of a primary oscillator in one embodiment of the multiple band oscillator system described in FIG. 1A.

FIG. 2 illustrates one example embodiment of primary oscillator 12. In this exemplary embodiment, primary oscillator 12 is a differential oscillator that, in some embodiments, includes a first primary oscillator transistor 38 and a second primary oscillator transistor 48. First primary oscillator transistor 38 is connected at the emitter terminal to a second current source 66, a tuning module 60, and capacitors 56 and 54. The collector terminal of first primary oscillator transistor 38 is connected to the first primary oscillator output 20 and resistor 34. The base terminal of first primary oscillator transistor 38 is connected to capacitor 54 and a first inductor 42. The second node of first inductor 42 which is not connected to the base terminal of first primary oscillator transistor 38 is connected to resistors 32 and 36, a second inductor 44, a second shared connection 72, and a capacitor 52. Second inductor 44 is connected to capacitors 50 and 52, and the base terminal of second primary oscillator transistor 48 through the node of second inductor 44 which is not connected to first inductor 42. The collector terminal of second primary oscillator transistor 48 is connected to a resistor 46 and second primary oscillator output 22. The base terminal of second primary oscillator transistor 48 is connected to second inductor 44 and capacitor 50. The emitter of second primary oscillator transistor 48 is connected to first current source 62, capacitors 50 and 58, and tuning module 60. A ground 64 is attached to first current source 62, a ground 68 is attached to second current source 66, and a ground 40 is attached to resistor 36 through nodes not common with any other component of primary oscillator 12. A primary current control 74 is connected to first current source 62 and second current source 66. A similar or dissimilar voltage source is applied to resistors 32, 34, and 46 through primary input 16 (FIG. 1A), with each voltage passing through each respective resistor prior to flowing through any other component of second oscillator 14. It is understood that the configuration illustrated by this example is exemplary only, and primary oscillator 12 may be configured in any way known to one skilled in the art. The use of any differential amplifier which meets the disclosed design requirements is consistent with the present disclosure. The components listed in primary oscillator 12 are intended to be illustrative only. For instance, in the example given by FIG. 2, an NPN transistor is used, but it is expressly understood that with appropriate modifications as known to one skilled in the art, a PNP transistor could be used.

In the embodiment illustrated by FIG. 2, first inductor 42 and second inductor 44 are configured as a single center tapped inductor. Inductors 42 and 44 can be configured as two discrete devices, or in a preferred embodiment as a single center tapped inductor 76. Single center tapped inductor 76 is, in some embodiments, the equivalent of both inductors 42 and 44. The use of single center tapped inductor 76 instead of inductors 42 and 44 may significantly reduce the space requirements of multiple band oscillator system 10. It is further expressly understood that first inductor 42 and second inductor 44 or single center tapped inductor 76 may be replaced with any other components capable of meeting oscillator operation, including, but not limited to, any resonating component known to one skilled in the art. Primary oscillator 12 is coupled to secondary oscillator 14 through a first shared connection 70 and second shared connection 72.

In one embodiment, primary oscillator 12 will create a differential output, when both the current signal and voltage sources are active. The term "active" when referring to the state of either the primary oscillator 12 or the secondary oscillator 14 corresponds to the state in which the oscillator is generating an output, and generally requires the oscillator (e.g. primary oscillator 12 or secondary oscillator 14) have both an active current source and voltage input (e.g. both current source and voltage input are "on"). During the operation of primary oscillator 12, first primary oscillator transistor 38, second primary oscillator transistor 48, inductors 42, 44 and capacitors 50, 54, 56, and 58 provide a negative resistance causing an oscillating output at first primary oscillator transistor 38 and second primary oscillator transistor 48. In the embodiment of FIG. 2, the output of transistors 38 and 48 are out of phase, causing a null or virtual ground across capacitor 52. Therefore, even though capacitor 52 is located within primary oscillator 12, capacitor 52 is not part of the resonating circuitry of primary oscillator 12. Consequently, capacitor 52 does not contribute significantly to the tuning frequency of the primary oscillator 12.

The phrase "virtual ground" refers to a point in a circuit as being maintained close to the circuit's ground or reference level electric potential. A virtual ground is due to the actions or effects of the parts in the circuit. The virtual ground in primary oscillator 12 is present due to the lack of a voltage differential between the nodes connecting capacitor 52. It is called "virtual" since this point does not have any physical electrical connection to ground.

It will be understood by those skilled in the art that power +Vcc illustrated by FIG. 2 may be positive, negative or different from each other as required by the bias needs of the specific circuit implementation. Primary current control 74, which may be activated through primary input 16, enables first current source 66 and second current source 62. First primary oscillator output 20 and second primary oscillator output 22 form a differential output that may be taken from either the collector as illustrated or emitter of first primary oscillator transistor 38 and either the collector or emitter of second primary oscillator transistor 48.

Figure 3:
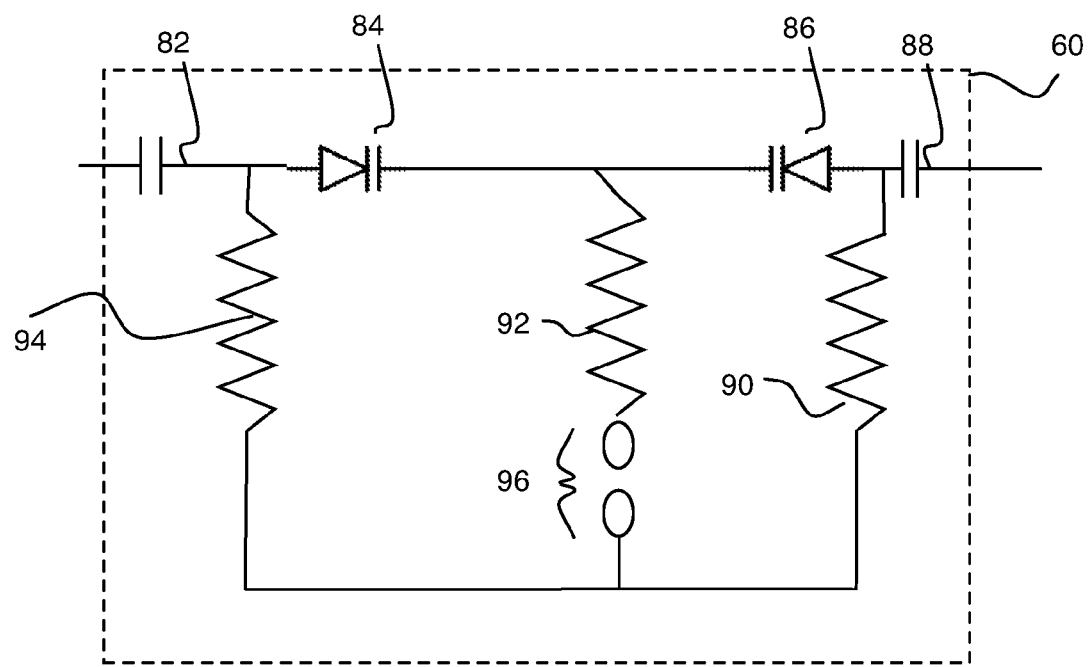
FIG. 3 is an exemplary diagram of a tuning module.

FIG. 3 illustrates a tuning module 60. In the example illustrated by FIG. 3, capacitor 82 is connected to resistor 94 and a first varactor diode 84. First varactor diode 84 is connected to a resistor 92 and a second varactor diode 86. Second varactor diode 86 is connected to a resistor 90 and a capacitor 88. Also illustrated in FIG. 3 is a tuning element 96 that is connected to a first node that contains connections to resistors 90, 94 and a second node connected to resistor 92. Connections to external sources for tuning module 60 are located at capacitors 82, 88 at node points which are not common with any other component within tuning module 60. Upon activation of the current sources 62 and 66 illustrated in FIG. 2, current flows through tuning module 60 within the range determined by first varactor diode 84 and second varactor diode 86 and tuning element 96. Tuning element 96 may be used as a predetermined frequency determining element. It is understood that the configuration illustrated by this example is exemplary only, and tuning module 60 may be configured in any way known to one skilled in the art.

In tuning module 60, first varactor diode 84 and second varactor diode 86 are placed in series. The tuning of a signal is made possible, in this embodiment, because of a virtual ground point between first varactor diode 84 and second varactor diode 86. This virtual ground is created because of the differential output of either the primary oscillator 12 or the secondary oscillator 14. Therefore, it is possible to have a low impedance node point without grounding multiple band oscillator system 10. This low impedance node point allows for tuning as known to one skilled in the art.

Figure 4:
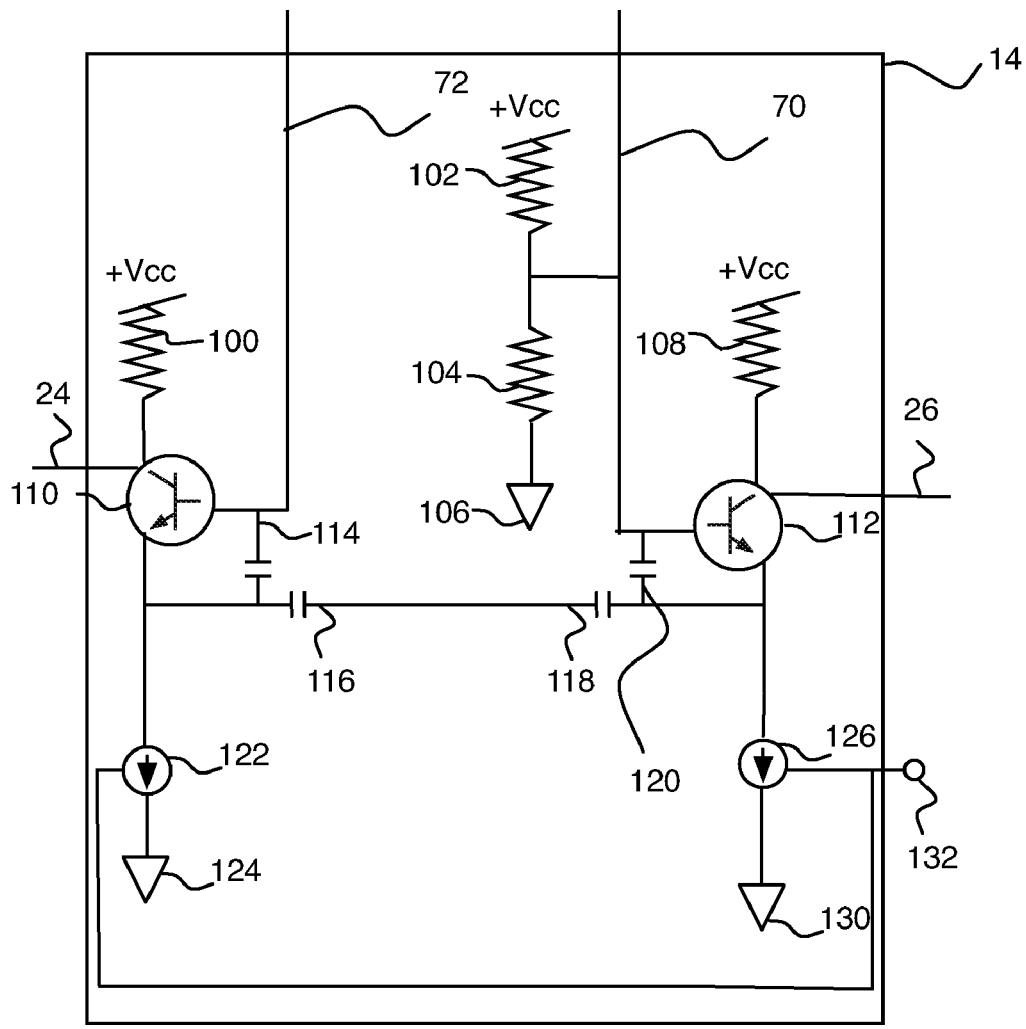
FIG. 4 is an exemplary schematic diagram of a secondary oscillator in one embodiment of the multiple band oscillator system described in FIG. 1A.

FIG. 4 illustrates one embodiment of secondary oscillator 14 in greater detail. In this embodiment, the secondary oscillator 14 is a differential oscillator. In the embodiment illustrated by FIG. 4, first secondary oscillator output 24 is connected to the emitter of first secondary oscillator transistor 110. The emitter of first secondary oscillator transistor 110 is also connected to capacitors 114 and 116, and a third currents source 122. The collector of first secondary oscillator transistor 110 is connected to a resistor 100. The base of first secondary oscillator transistor 110 is connected to capacitor 114 and second shared connection 72 at a node not common with any other terminal of first secondary oscillator transistor 110. Capacitor 116 is connected to a capacitor 118 at a unique node. Capacitor 118 is connected at the node which is not common with capacitor 116 to a fourth current source 126, a second secondary oscillator transistor 112, and a capacitor 120. The base of second secondary oscillator transistor 112 is connected to resistors 102 and 104, and capacitor 120. The collector of second secondary oscillator transistor 112 is connected to resistor 108. The emitter of second secondary oscillator transistor 112 is connected to fourth current source 126, second secondary oscillator output 26, capacitors 118 and 120 at a node which is not common with the base of second secondary oscillator transistor 112. A secondary current control 132 is connected to fourth current source 126 and a third current source 122. A ground 106 is connected to resistor 104, a ground 124 is connected to current source 122, and a ground 130 is connected to current source 126. Each ground listed is connected through a unique node to the respective component the ground is connected to. A similar or dissimilar voltage source is applied to resistors 100, 102, and 108 through secondary input 18 (FIG. 1A), with each voltage passing through each respective resistor prior to flowing through any other component of second oscillator 14. It is further understood that the configuration illustrated by this figure is exemplary only, and secondary oscillator 14 may be configured in any way known to one skilled in the art.

Secondary oscillator 14 may be activated by a signal that is transmitted through secondary input 18 (FIG. 1). Secondary input 18 may, in some embodiments, activate secondary current control 132 that, in turn, enables current sources 126 and 122. When secondary oscillator 14 is activated, first secondary oscillator transistor 110 and second secondary oscillator transistor 112 provide a negative resistance with a frequency of oscillation determined by the tuning module 60 and capacitor 52 in the primary oscillator 12 together with capacitors 114, 116, 118, and 120 in the secondary oscillator 14. Unlike primary oscillator 12, secondary oscillator 14 provides a differential in voltage across capacitor 52 (FIG. 2).

It will be understood by those skilled in the art that the control voltages +Vcc illustrated by FIG. 4 may be positive, negative or different from each other as required by the bias needs of the specific circuit implementation. First secondary oscillator transistor 110 and second secondary oscillator transistor 112 form a differential output that may be taken from either the collector or emitter of first secondary oscillator transistor 110 and second secondary oscillator transistor 112. It is expressly understood that the disclosed differential oscillator is illustrative only and may be implemented in other forms and by other oscillator types. In the preferred embodiments shown in FIG. 2 and FIG. 4, the output is taken from the collectors. However, it is expressly understood that in either the primary or secondary oscillator, output may taken from collectors, emitters, or combination thereof.

Figure 5:
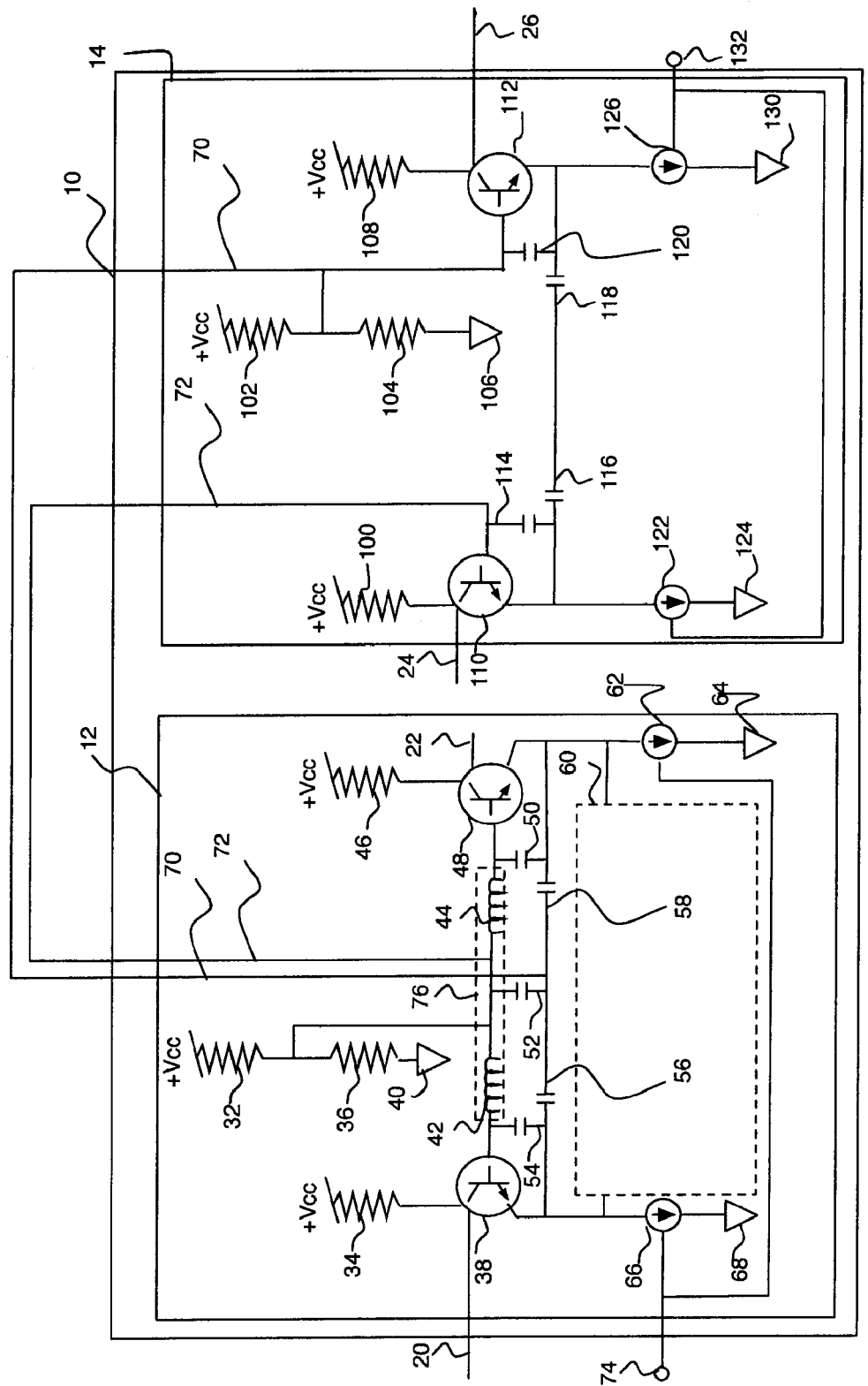
FIG. 5 is an exemplary schematic diagram of the multiple band oscillator system of FIG. 1A illustrating one embodiment of the coupling between the primary oscillator and secondary oscillator.

FIG. 5 illustrates an exemplary coupling between primary oscillator 12 and secondary oscillator 14 as depicted in FIG. 2 and FIG. 4. In this embodiment, primary oscillator 12 and secondary oscillator 14 are coupled though first shared connection 70 and second shared connection 72. This configuration allows the tuning module 60 and the inductive elements (e.g. first inductor 42 and second inductor 44) of primary oscillator 12 to be shared with secondary oscillator 14, thus greatly reducing the circuit space otherwise required in integrated circuit implementations of multiple band oscillators.

The operation of the combination of primary oscillator 12 and secondary oscillator 14 requires two differential negative resistance cells. A differential negative resistance cell may be made up of two transistors. In the example embodiment illustrated by FIG. 5, a primary differential negative resistance cell is made up of first primary oscillator transistor 38 and second primary oscillator transistor 48. A secondary differential negative resistance cell is made up of first secondary oscillator transistor 110 and second secondary oscillator transistor 112. During the operation of primary oscillator 12, first inductor 42 and second inductor 44 are shunted by a series connection of two capacitors 50 and 54 which are substantially similar. Either the center tap of first inductor 42 and second inductor 44 or the center tap of single centered tapped inductor 76 is connected through capacitor 52. The primary differential negative resistance cell is attached to the terminals of the first inductor 42 and second inductor 44 such that virtual grounding occurs at the center tap of the combined inductors 42 and 44, or at the center tap of the single centered tapped inductor 76 to cause a virtual ground at capacitor 52. This causes capacitor 52 to be isolated from the oscillator frequency determining network of primary oscillator 12.

As previously stated, capacitor 52 is ineffective as a frequency determining component in the primary oscillator 12 because it is located across a virtual ground in primary oscillator 12. However, capacitor 52 is part of the frequency determining components in the secondary oscillator 14. When secondary oscillator 14 is active, a voltage differential is applied between first shared connection 70 and second shared connection 72. When this voltage differential exists, capacitor 52 will become active, and a current will flow across capacitor 52 and into tuning module 60. The dual role of capacitor 52 not only facilitates the sharing of first inductor 42 and second inductor 44, but also allows for the tuning of the secondary oscillator to an arbitrary offset frequency from the frequency of the primary oscillator 12. Primary oscillator 12 and secondary oscillator 14 are coupled together, but tuned independently. This configuration reduces the phase noise that would otherwise be present if a single oscillator was required to tune across the bandwidth necessary to cover the multiple frequencies. In addition, this configuration also allows the frequencies of the two oscillators to be arbitrarily offset from each other. The multiple frequency bands are not required to be harmonically related, but they can be, if desired.

In the example embodiment illustrated by FIG. 5, during the operation of secondary oscillator 14, there is no virtual ground created by the primary differential negative resistance cell because first primary oscillator transistor 38 and second primary oscillator transistor 48 are not active. The secondary differential negative resistance cell is active during the operation of secondary oscillator 14 as both first secondary oscillator transistor 110 and second secondary oscillator transistor 112 are active, and results in signals being transmitted through both first shared connection 70 and second shared connection 72. The connection of first shared connection 70 and second shared connection 72 also permits electrical connection between secondary oscillator 14 and first inductor 42, second inductor 44, and tuning module 60. Capacitor 52 becomes active as a frequency-determining element for secondary oscillator 14.

While the multiple band operation contemplated in FIG. 5 is illustrated with two oscillators, it is expressly understood that the use of any number of oscillators is consistent with this disclosure. It is further explicitly understood that while operation of the oscillators within the multiple band oscillator system is illustrated as being in an alternating fashion, it is understood that both may, in other embodiments, be active at any given time. The examples and figures are given for illustrative purposes only, and the scope of this disclosure includes, but is not limited to, any configuration of multiple oscillators where one or more oscillators share one or more resonating or tuning elements.

Figure 6:
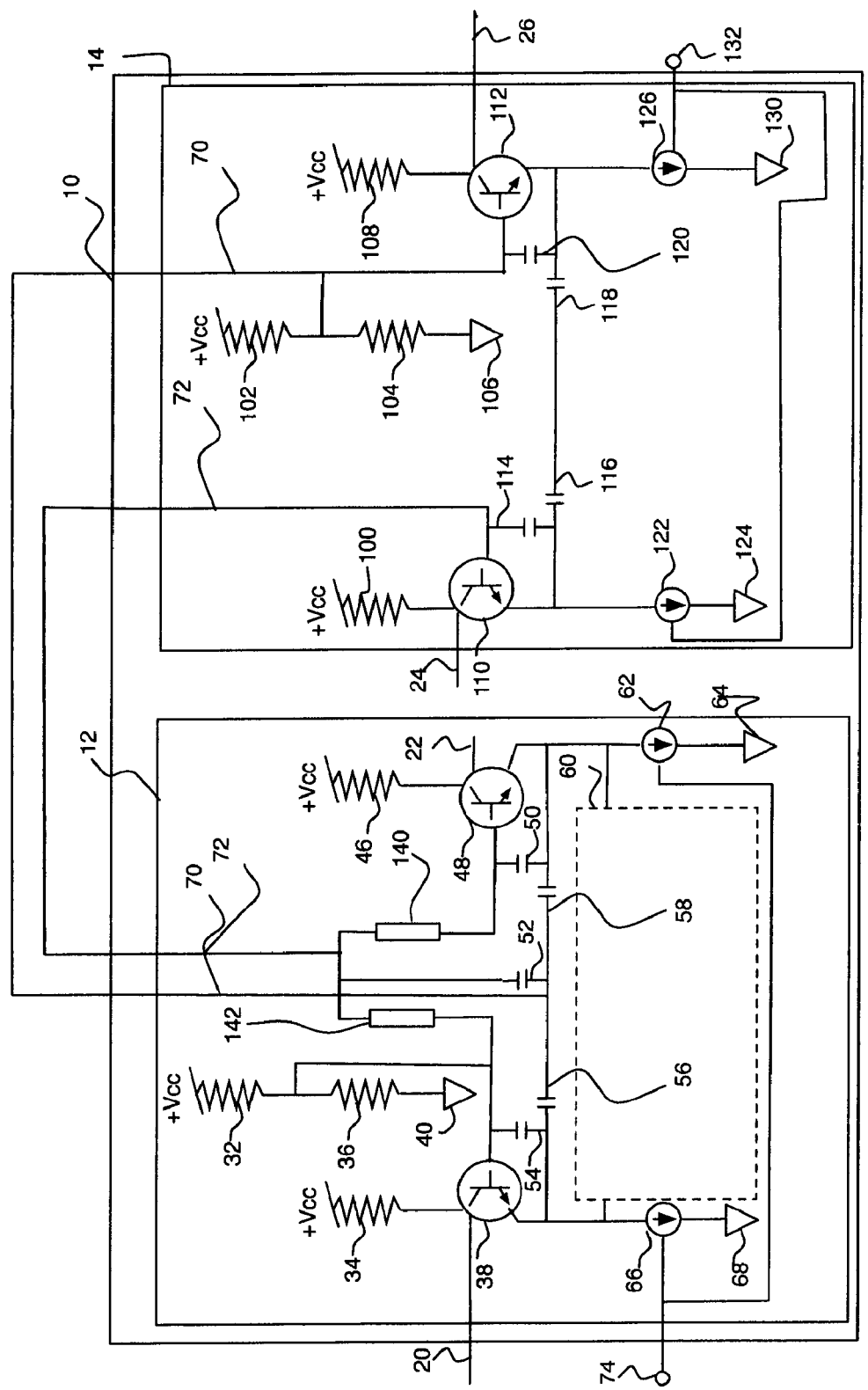
FIG. 6 is another exemplary schematic diagram of the multiple band oscillator system of FIG. 1A.

FIG. 6 illustrates another exemplary embodiment of multiple band oscillator system 10. It is explicitly understood that the inductors illustrated in FIG. 5 may be replaced with any resonating element. In the embodiment of FIG. 6, first inductor 42 and second inductor 44 have been replaced with coaxial resonators 140 and 142. In this exemplary embodiment, coaxial resonator 142 is not connected to resistors 32 and 36, and capacitor 52 is connected only to resonators 140 and 142, and capacitors 56 and 58. In this embodiment, the capacitor 52 also does not function as a frequency-determining element in the primary oscillator 12, but is part of the frequency determining elements in the secondary oscillator 14. Capacitor 52 may be switch selectable through primary input 16 or secondary input 18 to be stepped in frequency without impacting phase noise.

The resonators illustrated by FIG. 6 may also be implemented as co-axial resonators, transmission lines, discrete inductors or active resonators as will be understood by those skilled in the art. It is explicitly understood that any type of resonating element can be used in the place of the coaxial resonator illustrated in FIG. 6 and the inductors illustrated in FIG. 5 including, but not limited to, any cavity resonator or other resonator structure.

Figure 7:
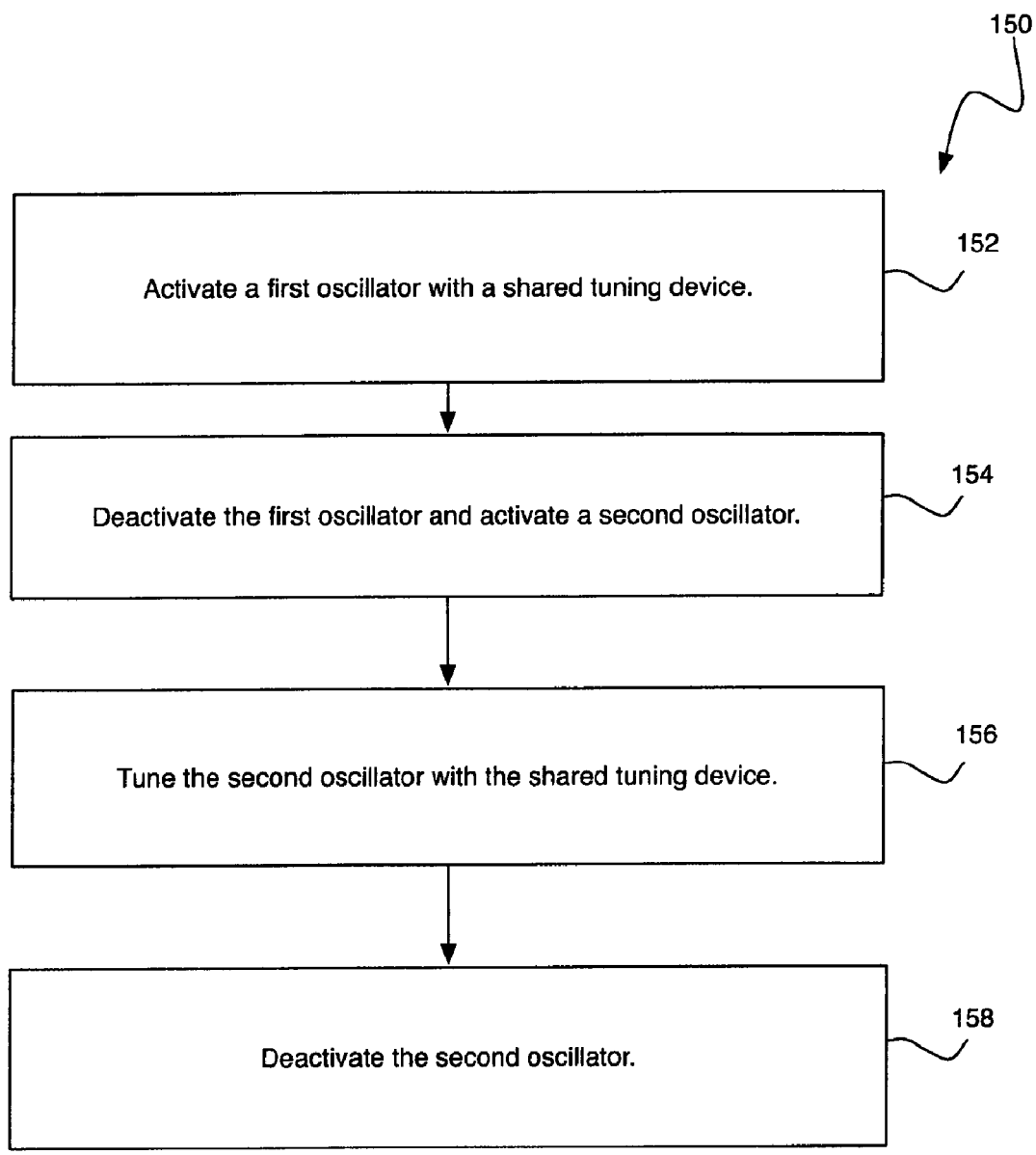
FIG. 7 is a flowchart of method of using a shared tuning device.

FIG. 7 is an example of a method 150 in which multiple band oscillator system 10 is used. In this method, multiple band oscillator system 10 activates a first oscillator with a shared tuning device (Block 152). Multiple band oscillator system 10 deactivates the first oscillator and activates a second oscillator (Block 154). Multiple band oscillator system 10 also tunes the second oscillator with the shared tuning device (Block 156). In addition, the multiple band oscillator system 10 can deactivate the second oscillator (Block 158).

Figure 8:
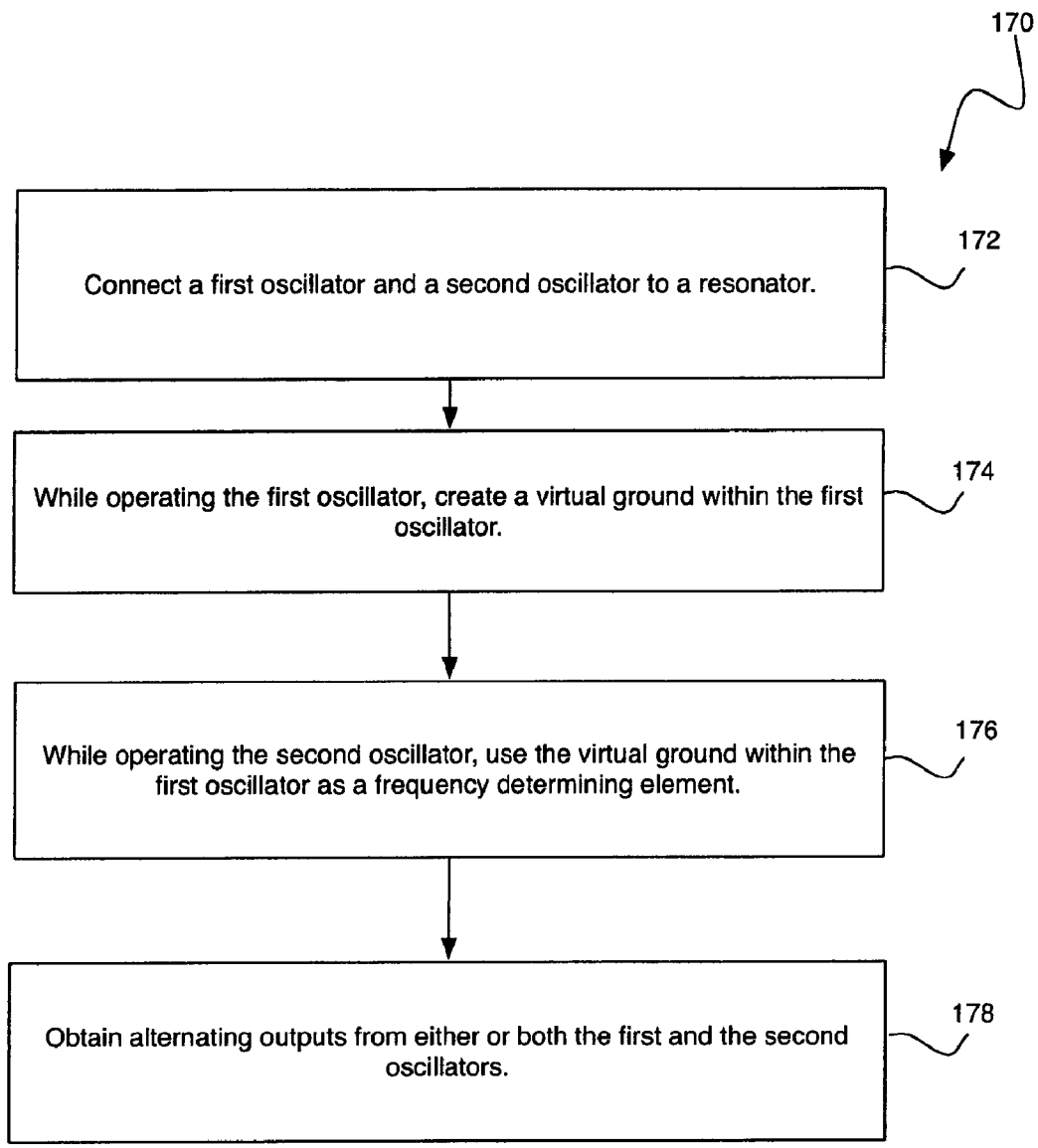
FIG. 8 is another method of using a shared tuning device.

FIG. 8 is an example of a second method 170 in which multiple band oscillator system 10 is used. In this embodiment, a connection between a first oscillator and a second oscillator to a resonator is created (Block 172). While operating the first oscillator, a virtual ground within the first oscillator is created (Block 174). While operating the second oscillator, the virtual ground within the first oscillator is used as a frequency-determining element (Block 176). Alternating outputs are created from either or both the first and the second oscillator (Block 178).

Figure 9:
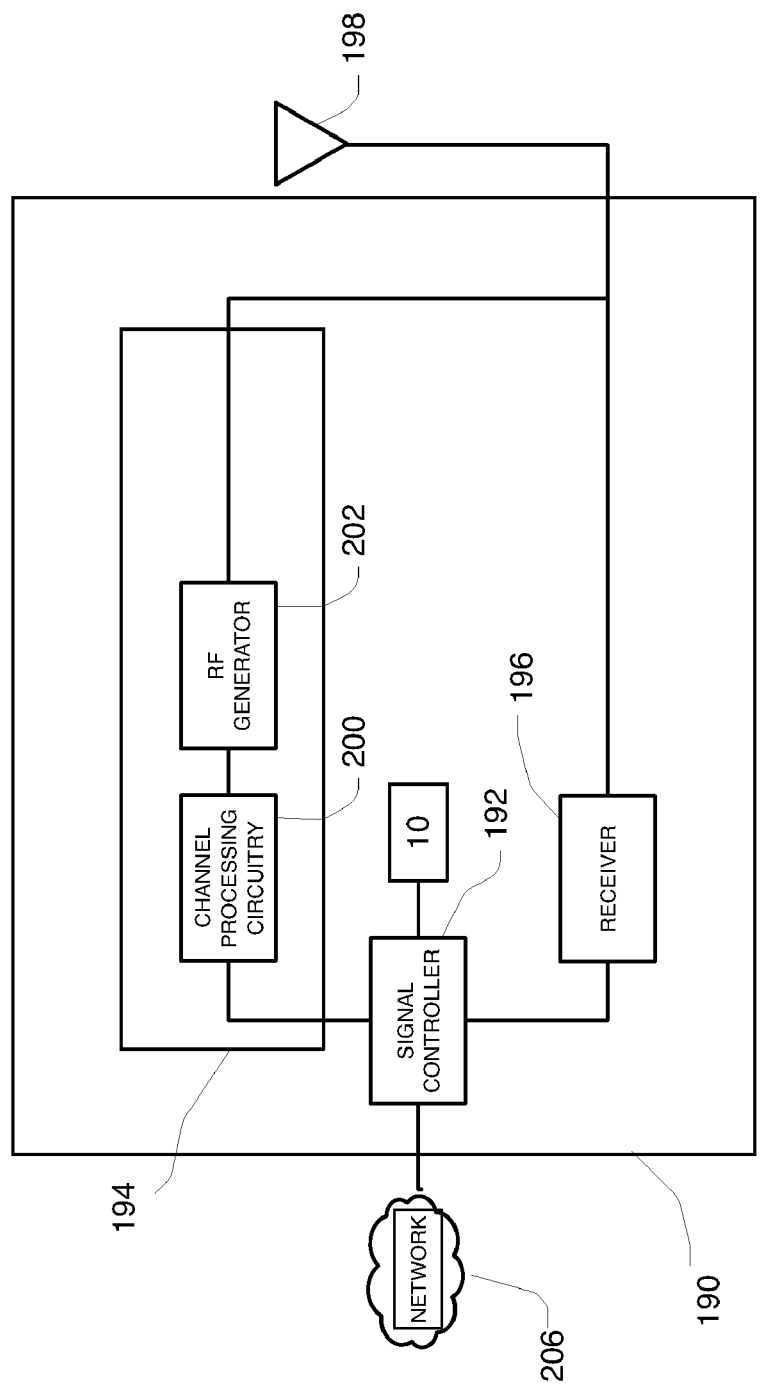
FIG. 9 is a block diagram of a base station.

As shown in FIG. 9, multiple band oscillator system 10 (FIG. 1) may be incorporated as an input to signal controller 192 into a base station 190. Base station 190 is a medium to high-power multi-channel, two-way radio in a fixed location. Typically low-power, single-channel, two-way radios or wireless devices such as mobile phones, portable phones and wireless routers may use multiple band oscillator system 10. Base station 190 may comprise signal controller 192 which is coupled to multiple band oscillator system 10, transmitter 194, and a receiver 196. Transmitter 194 and receiver 196 (or combined transceiver) is further coupled to an antenna 198. In base station 190, digital signals are processed in signal controller 192. Multiple band oscillator system 10 provides an oscillation signal for base station 190. The oscillation signals may be signals for a wireless communication system, such as signals that convey voice or data intended for a mobile terminal (not shown). Base station 190 may employ any suitable wireless technologies or standards including, but not limited to, 2G, 2.5G, 3G, GSM, IMT-2000, UMTS, iDEN, GPRS, 1xEV-DO, EDGE, DECT, PDC, TDMA, FDMA, CDMA, W-CDMA, LTE, TD-CDMA, TD-SCDMA, GMSK, OFDM, WiMAX, the family of IEEE §802.11 standards, the family of IEEE §802.16 standards, IEEE §802.20, and frequency agnostic radio technology such as DTC. Signal controller 192 then transmits the digital signals to transmitter 194, which includes a channel processing circuitry 200. Channel processing circuitry 200 encodes each digital signal, and a radio frequency (RF) generator 202 modulates the encoded signals onto an RF signal. The resulting output signal is transmitted over antenna 198 to the mobile terminal. Antenna 198 also receives signals sent to base station 190 from the mobile terminal. Antenna 198 transmits the signals to receiver 196 that demodulates them into digital signals and transmits them to signal controller 192 where they may be relayed to an external network 206. Base station 190 may also comprise auxiliary equipment such as cooling fans or air exchangers for the removal of heat from base station 190.

While preferred embodiments of the invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). Use of broader terms such as "comprises", "includes", "having", etc. should be understood to provide support for narrower terms such as "consisting of", "consisting essentially of", "comprised substantially of", etc.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the preferred embodiments of the present invention. The discussion of a reference in the Description of Related Art is not an admission that it is prior art to the present invention, especially any reference that may have a publication date after the priority date of this application. The disclosures of all patents, patent applications, and publications cited herein are hereby incorporated by reference, to the extent that they provide exemplary, procedural or other details supplementary to those set forth herein.

What is claimed is:

1. A multiple band oscillator system comprising:
    a first oscillator of the multiple band oscillator system having a first input, a resonating element, a first output, and a second output, wherein the first oscillator has a first oscillator frequency;
    a second oscillator of the multiple band oscillator system having a second input, a third output, and a fourth output, wherein the second oscillator has a second oscillator frequency, wherein the second oscillator frequency is different from the first oscillator frequency; and
    a tuning capacitive element of the multiple band oscillator system coupled to the first and second oscillators for determining the second oscillator frequency, wherein the first and second oscillators share the resonating element, and wherein the first and second oscillators are both capable of operating the resonating element.

2. The multiple band oscillator system of claim 1, further comprising a tuning module within the first oscillator.

3. The multiple band oscillator system of claim 2, wherein the second oscillator is coupled to the tuning module.

4. The multiple band oscillator system of claim 1, wherein a virtual ground is created at the tuning capacitive element.

5. The multiple band oscillator system of claim 1, wherein during the operation of the second oscillator, the tuning capacitive element becomes a frequency determining element for the second oscillator.

6. The multiple band oscillator system of claim 1, further comprising a third oscillator with a third input and a fifth output and a sixth output, wherein the third oscillator shares the resonating element.

7. The multiple band oscillator system of claim 1, wherein multiple frequency bands serviced are selected from the group of GSM, UMTS, CDMA, LTE, WiMAX, EDGE, IEEE §802.11 family of standards, IEEE §802.16 family of standards, IEEE §802.20, or any combination of the foregoing.

8. A method of operating a multiple band oscillator system, comprising:
    activating a first oscillator of the multiple band oscillator system with a resonator coupled to a second oscillator of the multiple band oscillator system;
    obtaining a first differential output at a first frequency from the first oscillator;
    activating the second oscillator using the resonator in the first oscillator;
    creating a low impedance node; and
    obtaining a second differential output at a second frequency from the second oscillator, wherein the multiple band oscillator system comprises only one inductor, wherein the first oscillator and the second oscillator share the resonator and wherein the second frequency is different from the first frequency.

9. The method of claim 8, wherein the first oscillator further comprises a tuning module.

10. The method of claim 8, wherein the low impedance node is a virtual ground.

11. The method of claim 10, wherein the low impedance node is created within the multiple band oscillator system.

12. The method of claim 8, further comprising deactivating the first oscillator prior to activating the second oscillator.

13. The method of claim 11, further comprising using a capacitor as a frequency determining element of the second oscillator while the second oscillator is active.

14. The method of claim 8, further comprising switching between activation of the first oscillator and the second oscillator.

15. The method of claim 8, wherein the resonator is an inductor, coaxial resonator, or a cavity resonator.

16. A multiple band oscillator system comprising:
    a first oscillator of the multiple band oscillator system having a resonator and a first oscillation frequency;
    a second oscillator of the multiple band oscillator system coupled to the first oscillator, sharing the resonator with the first oscillator and having a second oscillation frequency, wherein the second oscillation frequency is different from the first oscillation frequency;

a capacitive element of the multiple band oscillator system coupled to the second oscillator for determining the second oscillation frequency; and a control signal, wherein the control signal selectively activates the first oscillator and second oscillator, and wherein the output of the multiple band oscillator system is switched between the first and second oscillation frequencies.

17. The multiple band oscillator system of claim 16, wherein the capacitive element is used as a frequency determining element.

18. The multiple band oscillator system of claim 16, wherein the first oscillator and second oscillator operate in an alternating fashion.

19. The multiple band oscillator system of claim 1, wherein the multiple band oscillator system comprises only one inductor.

20. The multiple band oscillator system of claim 16, wherein the multiple band oscillator system comprises only one inductor.

* * * * *